United States Patent
Shiobara et al.

(10) Patent No.: US 10,308,803 B2
(45) Date of Patent: Jun. 4, 2019

(54) EPOXY RESIN CONTAINING SILICONE-MODIFIED EPOXY RESIN AND POLYVALENT CARBOXYLIC ACID COMPOUND, AND CURED PRODUCT THEREOF

(71) Applicants: Shin-Etsu Chemical Co., Ltd., Tokyo (JP); Nippon Kayaku Kabushiki Kaisha, Tokyo (JP)

(72) Inventors: Toshio Shiobara, Tokyo (JP); Junichi Sawada, Gunma (JP); Miyuki Wakao, Gunma (JP); Tsutomu Kashiwagi, Gunma (JP); Naofusa Miyagawa, Tokyo (JP); Yoshihiro Kawada, Tokyo (JP); Chie Sasaki, Tokyo (JP)

(73) Assignees: Shin-Etsu Chemical Co., Ltd., Tokyo (JP); Nippon Kayaku Kabuhiki Kaisha, Tokyo (JP)

(*) Notice: Subject to any disclaimer, the term of this patent is extended or adjusted under 35 U.S.C. 154(b) by 209 days.

(21) Appl. No.: 14/973,162

(22) Filed: Dec. 17, 2015

(65) Prior Publication Data
US 2016/0177085 A1 Jun. 23, 2016

(30) Foreign Application Priority Data

Dec. 18, 2014 (JP) ................. 2014-255856

(51) Int. Cl.
| | |
|---|---|
| C08L 63/00 | (2006.01) |
| C08L 83/06 | (2006.01) |
| C08G 59/32 | (2006.01) |
| C08G 59/42 | (2006.01) |
| H01L 23/29 | (2006.01) |
| G02B 1/04 | (2006.01) |

(52) U.S. Cl.
CPC .......... *C08L 63/00* (2013.01); *C08G 59/3281* (2013.01); *C08G 59/42* (2013.01); *C08G 59/4215* (2013.01); *G02B 1/04* (2013.01); *H01L 23/296* (2013.01); *C08L 2205/025* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,492,981 A | 2/1996 | Hoehn et al. | |
| 6,815,520 B2 | 11/2004 | Yoneda et al. | |
| 2003/0071366 A1* | 4/2003 | Rubinsztajn | C08G 59/24 257/791 |
| 2011/0251305 A1 | 10/2011 | Ueno et al. | |
| 2013/0323994 A1* | 12/2013 | Kiyoyanagi | C08G 59/4246 442/175 |

FOREIGN PATENT DOCUMENTS

| | | |
|---|---|---|
| JP | H7-97433 A | 4/1995 |
| JP | 2002-265787 A | 9/2002 |
| JP | 2006241462 A | 9/2006 |
| JP | 2006-282988 A | 10/2006 |
| JP | 2008-45088 A | 2/2008 |
| JP | 2011063686 A | 3/2011 |
| JP | 2011102337 A | 5/2011 |
| JP | 2012-092172 A | 5/2012 |
| JP | 2012087249 A | 5/2012 |
| JP | 2012144678 A | 8/2012 |
| JP | 2014 145073 A | 8/2014 |
| JP | 2015067798 A | 4/2015 |
| JP | 2015098524 A | 5/2015 |
| SG | 181122 A1 | 7/2012 |
| WO | 2011/058962 A1 | 5/2011 |
| WO | 2011065044 A1 | 6/2011 |
| WO | 2013/140601 A1 | 9/2013 |

OTHER PUBLICATIONS

European Search Report for corresponding European Application No. EP 15 20 0397 dated Apr. 29, 2016.

* cited by examiner

*Primary Examiner* — Michael J Feely
(74) *Attorney, Agent, or Firm* — Wood, Phillips, Katz, Clark & Mortimer

(57) ABSTRACT

A silicone-modified epoxy resin composition that offers a cured product excellent in low permeability to gas, mechanical strength, and heat resistance and transparency and further offers an optical semiconductor sealing material excellent in heat cycle resistance, and a cured epoxy resin product obtained by curing the composition. The epoxy resin composition comprises the following components (A) to (C):

(A) a silicone-modified epoxy resin having a cyclic siloxane structure,
(B) a silicone-modified epoxy resin having a branched siloxane structure, and
(C) an epoxy resin curing agent containing a polyvalent carboxylic acid having a tricyclodecane structure and a carboxylic anhydride compound.

8 Claims, No Drawings

EPOXY RESIN CONTAINING SILICONE-MODIFIED EPOXY RESIN AND POLYVALENT CARBOXYLIC ACID COMPOUND, AND CURED PRODUCT THEREOF

BACKGROUND ART

Compositions containing a bisphenol A-type epoxy resin excellent in adhesiveness and/or mechanical strength, an epoxy resin free from UV absorption, for example, a hydrogenated bisphenol A-type epoxy resin or an alicyclic epoxy resin, a curing agent, and a curing catalyst are frequently used as resin compositions for optical semiconductor device sealing. Such compositions, however, disadvantageously cause discoloration or cracks due to light, heat, or the like from LED devices, as the luminance and output of the LED devices are increased.

To solve these problems, a resin has been known which contains an epoxy group introduced into a silicone resin that offers a UV absorption-free and flexible cured product. For example, the following has been known: a silicone resin having one or more cyclic ether-containing groups such as a glycidyl group and an epoxycyclohexyl group (JP 2008-45088), a reaction product of epoxyalkoxysilane and silanol (JP H7-97433), and an alicyclic epoxy-modified silicone resin used in combination with an alicyclic epoxy resin (JP 2006-282988). Silicone resins, however, are very highly permeable to gas as compared with epoxy resins. Therefore, products having a higher silicone content are more difficult to use in usage required to have low permeability to gas. Accordingly, an addition reaction-type phenyl-based silicone resin composition has been disclosed as a resin composition having low permeability to gas (JP 2002-265787), but is still unsatisfactory in terms of low permeability to gas and adhesiveness. In addition, an epoxy resin composition obtained using epoxy group-containing polysiloxane and a carboxylic anhydride compound as a curing agent for the polysiloxane has been disclosed (JP 2012-92172), but is unsatisfactory from the viewpoint of the heat discoloration resistance of a cured product.

SUMMARY OF INVENTION

The present invention has been made in light of the circumstances as mentioned above, and an object of the present invention is to provide a silicone-modified epoxy resin composition that offers a cured product excellent in low permeability to gas, mechanical strength, and heat resistance and transparency and further offers an optical semiconductor sealing material excellent in heat cycle resistance, and a cured epoxy resin product obtained by curing the composition.

The present inventors have conducted diligent studies in light of the actual situations as described above and consequently completed the present invention.

Specifically, the present invention relates to the following (1) to (9):

(1) An epoxy resin composition comprising the following components (A) to (C):
  (A) a silicone-modified epoxy resin represented by the formula (1),

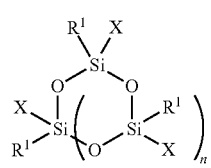

(1)

wherein $R^1$ represents a monovalent aliphatic hydrocarbon group having 1 to 6 carbon atoms or a monovalent aromatic hydrocarbon group having 6 to 12 carbon atoms; X represents an organic group having at least an epoxy group; n represents an integer of 1 to 3; and a plurality of groups $R^1$ or X present in the formula are the same or different from each other;

(B) a silicone-modified epoxy resin represented by the formula (2),

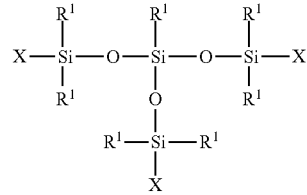

(2)

wherein $R^1$ and X are each as defined above; and a plurality of groups $R^1$ or X present in the formula are the same or different from each other; and (C) an epoxy resin curing agent containing a polyvalent carboxylic acid represented by the formula (3) and a carboxylic anhydride compound:

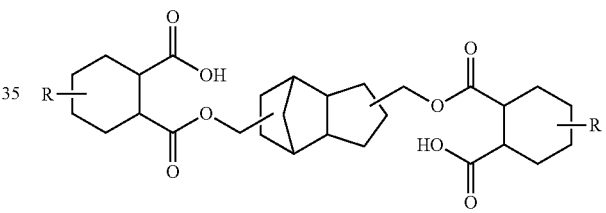

(3)

R = Me or COOH or H (2) The epoxy resin composition according to (1), wherein the components (A) to (C) are contained at the following ratios:

the amount of the component (A) is 5 to 95% by mass with respect to the total amount of the component (A) and the component (B), the amount of the component (B) is 5 to 95% by mass with respect to the total amount of the component (A) and the component (B), and the amount of the component (C) is 30 to 65 parts by mass with respect to 100 parts by mass in total of the component (A) and the component (B).

(3) The epoxy resin composition according to (1) or (2), wherein X is an epoxycyclohexylethyl group.

(4) The epoxy resin composition according to any one of (1) to (3), wherein the mixing ratio is set such that the total number of carboxyl groups and carboxylic anhydride groups in the epoxy resin curing agent (C) is 0.4 to 0.7 mol with respect to 1 mol of the total number of epoxy groups in the whole epoxy resin.

(5) The epoxy resin composition according to any one of (1) to (4), further comprising (D) an epoxy resin curing accelerator.

(6) The epoxy resin composition according to (5), further comprising (E) an antioxidant.

(7) The epoxy resin composition according to any one of (1) to (6), wherein the epoxy resin composition offers a cured product in which the temperature at a relative maximum point of the loss coefficient (tan δ=E"/E') indicated by a quotient of a loss elastic modulus (E") divided by a storage elastic modulus (E') is 145° C. or higher in DMA (dynamic mechanical analysis) analysis.

(8) A cured product prepared by curing an epoxy resin composition according to any one of (1) to (7).

(9) The epoxy resin composition according to any one of (1) to (7), wherein the epoxy resin composition is used for optical semiconductor sealing.

DESCRIPTION OF EMBODIMENTS

The epoxy resin composition of the present invention comprises the following components (A) to (C):

(A) a silicone-modified epoxy resin represented by the formula (1), (B) a silicone-modified epoxy resin represented by the formula (2), and (C) an epoxy resin curing agent containing a polyvalent carboxylic acid represented by the formula (3) and a carboxylic anhydride compound.

The component (A) is a silicone-modified epoxy resin represented by the following formula (1):

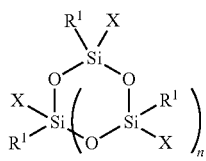
(1)

In the formula (1), $R^1$ represents a monovalent aliphatic hydrocarbon group having 1 to 6 carbon atoms or a monovalent aromatic hydrocarbon group having 6 to 12 carbon atoms; X represents an organic group having at least an epoxy group; and n represents an integer of 1 to 3. A plurality of groups $R^1$ or X present in the formula are the same or different from each other.

$R^1$ is a monovalent aliphatic hydrocarbon group having 1 to 6 carbon atoms or a monovalent aromatic hydrocarbon group having 6 to 12 carbon atoms. Specific examples of the monovalent aliphatic hydrocarbon group having 1 to 6 carbon atoms may include, but not limited to: saturated monovalent aliphatic hydrocarbon groups including alkyl groups such as a methyl group, an ethyl group, a n-propyl group, an isopropyl group, a n-butyl group, a t-butyl group, a heptyl group, a 2-ethylhexyl group, a heptyl group, and an octyl group; and unsaturated monovalent aliphatic hydrocarbon groups including alkenyl groups such as a vinyl group, an allyl group, an isopropenyl group, and a butenyl group. The monovalent aliphatic hydrocarbon group is preferably a methyl group, an ethyl group, a n-propyl group, an isopropyl group, a n-butyl group, a t-butyl group, or a heptyl group, more preferably a methyl group. Specific examples of the monovalent aromatic hydrocarbon group having 6 to 12 carbon atoms may include, but not limited to: aryl groups such as a phenyl group, a tolyl group, a xylyl group, and a naphthyl group; and aralkyl groups such as a benzyl group, a 2-phenylethyl group, and a 2-phenylpropyl group. The monovalent aromatic hydrocarbon group is preferably a phenyl group, a benzyl group, a 2-phenylethyl group, or a 2-phenylpropyl group, more preferably a phenyl group.

The organic group represented by X refers to a compound composed of C, H, N, and O atoms. Specific examples of the organic group containing at least an epoxy group may include, but not limited to, a 3,4-epoxycyclohexylethyl group and a 3-glycidoxypropyl group. A 3,4-epoxycyclohexylethyl group is preferred from the viewpoint of the heat resistance and transparency of a cured product. In this context, the number of carbon atoms in the organic group is preferably 1 to 20, more preferably 3 to 15. Also, a group having a 3,4-epoxycyclohexylethyl group or a 3-glycidoxypropyl group added to an alkylene group having 1 to 5 carbon atoms is preferred. In this case, a 3,4-epoxycyclohexylethyl group is particularly preferred from the viewpoint of the transparency and mechanical strength of a cured product.

n is an integer of 1 to 3 and is particularly preferably 2.

The epoxy equivalent weight (measured according to JIS K7236: 2001) of the silicone-modified epoxy resin (A) is preferably 180 to 250 g/eq, more preferably 185 to 200 g/eq. The epoxy equivalent weight of 180 g/eq or higher is preferred because the resulting cured product is not too hard and is excellent in heat cycle. The epoxy equivalent weight of 250 g/eq or lower is preferred because the resulting cured product is excellent in mechanical strength.

The viscosity (measured according to JIS Z8803: 2011) of the silicone-modified epoxy resin (A) at room temperature (25° C.) is preferably 2,000 to 6,000 mPa·s, more preferably 2,500 to 4,000 mPa·s. The viscosity of 2,000 to 6,000 mPa·s is preferred because the epoxy resin composition has a moderate viscosity.

The component (B) is a silicone-modified epoxy resin represented by the following formula (2):

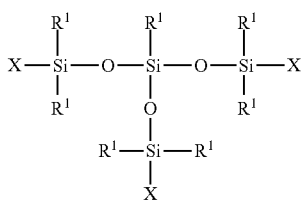
(2)

In the formula (2), $R^1$ and X are each as defined above. A plurality of groups $R^1$ or X present in the formula are the same or different from each other.

In the formula (2), at least one of a plurality of groups $R^1$ present is preferably a phenyl group from the viewpoint of the low gas transmission rate of a cured product.

The epoxy equivalent weight (measured according to JIS K7236) of the silicone-modified epoxy resin (B) is preferably 200 to 270 g/eq, more preferably 210 to 250 g/eq. The epoxy equivalent weight of 200 g/eq or higher is preferred because the resulting cured product is not too hard and is excellent in heat cycle. The epoxy equivalent weight of 270 g/eq or lower is preferred because the resulting cured product is excellent in mechanical strength.

The viscosity of the silicone-modified epoxy resin (B) at room temperature (25° C.) is preferably 500 to 3,000 mPa·s, more preferably 700 to 2,500 mPa·s. The viscosity of 500 to 3,000 mPa·s is preferred because the epoxy resin composition has a moderate viscosity.

The silicone-modified epoxy resin represented by the formula (1) or (2) may be obtained by the addition reaction of a hydrogen siloxane compound represented by the following formula (7) or (8) with a compound having an alkenyl group and an epoxy group:

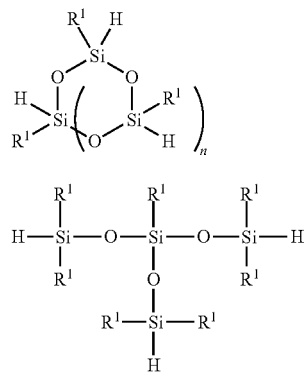

(7)

(8)

In the formulas (7) and (8), $R^1$ and n are each as defined above. A plurality of groups $R^1$ present in the formula are the same or different from each other.

The compound having an alkenyl group and an epoxy group is not particularly limited as long as the compound has an epoxy group and an alkenyl group in the same molecule. A compound represented by the following formula (9) or (10) is preferred from the viewpoint of the reactivity of the resulting silicone-modified epoxy resin and the transparency and heat resistance of a cured product.

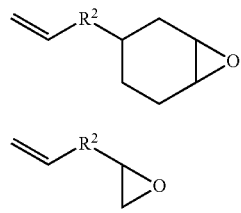

(9)

(10)

In the formulas (9) and (10), $R^2$ represents an alkylene group having 0 to 4 carbon atoms optionally containing an ester or ether bond and is specifically, a methylene group, an ethylene group, a propylene group, a butylene group, an isopropylene group, a methyl ester group, a methyl ether group, a methyleneoxymethylene group, a methyleneoxyethylene group, an ethyleneoxyethylene group, or the like.

The reaction ratio between the hydrogen siloxane compound represented by the formula (7) or (8) and the compound having an epoxy group and an alkenyl group in the same molecule is preferably a ratio of 0.25 to 1.0, particularly, 0.5 to 0.8 SiH groups in the hydrogen siloxane compound to one alkenyl group in the compound having an epoxy group and an alkenyl group in the same molecule. The hydrosilylation reaction may follow a conventional method known in the art.

The compound represented by the formula (1) or (2) may be obtained, for example, by the oxidation and epoxidation of a polyvalent olefin compound represented by the following formula (11) or (12), in addition to the aforementioned method for obtaining the compound by the hydrosilylation reaction of hydrogen siloxane with a compound having an epoxy group and an alkenyl group in the same molecule:

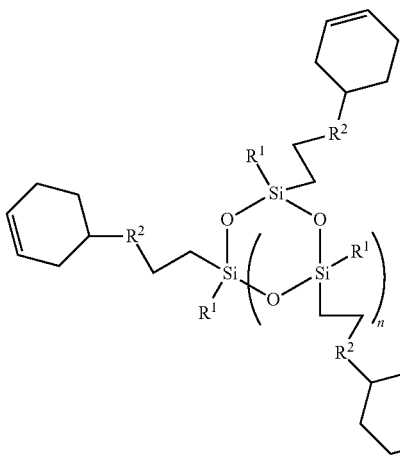

(11)

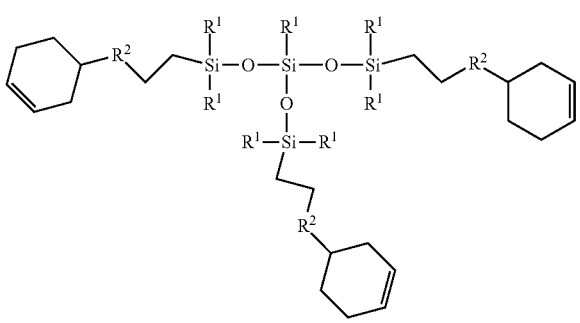

(12)

In the formula (11) or (12), $R^1$, $R^2$, and n are each as defined above. A plurality of groups $R^1$ or $R^2$ present in the formula are the same or different from each other.

Examples of an approach for the oxidation may include, but not limited to, an oxidation method using a peracid such as peracetic acid, an oxidation method using hydrogen peroxide water, and an oxidation method using air (oxygen).

Specific examples of an approach for the epoxidation using a peracid may include, but not limited to, an approach described in Japanese Patent Laid-Open No. 2006-52187. Examples of a starting material that may be used for the peracid may include, but not limited to, organic acids such as formic acid, acetic acid, propionic acid, maleic acid, benzoic acid, m-chlorobenzoic acid, and phthalic acid, and acid anhydrides thereof. Among them, formic acid, acetic acid, or phthalic anhydride is preferably used from the viewpoint of the efficiency of producing an organic peracid through reaction with hydrogen peroxide, reaction temperature, operational convenience, economy, etc. Particularly, formic acid or acetic acid is more preferably used from the viewpoint of the convenience of reaction operation.

Various approaches may be applied to an approach for the epoxidation using hydrogen peroxide water. Specifically, an approach as listed in Japanese Patent Laid-Open No. S59-108793, Japanese Patent Laid-Open No. S62-234550, Japanese Patent Laid-Open No. H5-213919, Japanese Patent Laid-Open No. H11-349579, Japanese Patent Publication No. H1-33471, Japanese Patent Laid-Open No. 2001-17864, Japanese Patent Publication No. H3-57102, etc., may be used.

Alternatively, a method described in Non Patent Literature 1 (James V. Crivello and Ramesh Narayan (1996), Novel Epoxynorbornane Monomers. 1. Synthesis and Characterization, Macromolecules, Vol. 29, p. 433-438) may also be used. Specifically, the compound may be obtained by the epoxidation of an alkenyl group using Oxone.

The olefin compound represented by the formula (11) or (12) may be obtained by the addition reaction of the hydrogen siloxane compound represented by the formula (7) or (8) with a cyclohexene compound having an alkenyl group (e.g., vinylcyclohexene).

The component (C) is an epoxy resin curing agent containing a polyvalent carboxylic acid represented by the following formula (3) and a carboxylic anhydride compound:

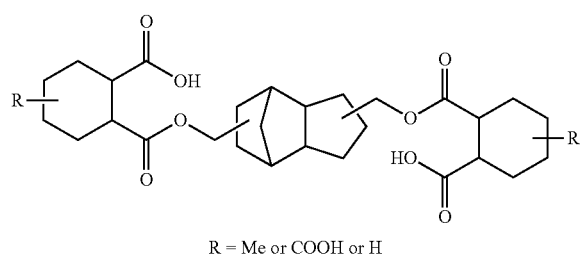

(3)

R = Me or COOH or H

The carboxylic anhydride compound in the component (C) may be any compound containing a carboxylic anhydride group in the molecule and is preferably one or more compounds selected from the following formulas (4) to (6) from the viewpoint of the transparency of a cured product:

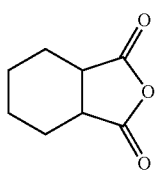

(4)

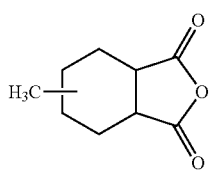

(5)

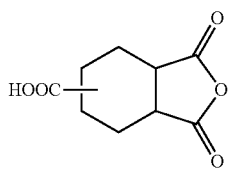

(6)

The content of the polyvalent carboxylic acid represented by the formula (3) in the component (C) is preferably 20 to 80% by mass, more preferably 30 to 60% by mass. The polyvalent carboxylic acid contained at 20% by mass or more is preferred because the resulting cured product is less likely to have a hollow and is excellent in mechanical strength. The polyvalent carboxylic acid contained at 80% by mass or less is preferred because the viscosity does not rise too much.

The functional group equivalent weight of the component (C) is preferably 210 to 350 mg KOH/g, more preferably 260 to 330 mg KOH/g. The functional group equivalent weight of 210 mg KOH/g or higher is preferred because the resulting cured product is not too hard. The functional group equivalent weight of 350 mg KOH or lower is preferred because the resulting cured product is excellent in mechanical physical properties. In this context, the functional group refers to a carboxyl group for the polyvalent carboxylic acid and an acid anhydride group represented by —CO—O—CO— for the carboxylic anhydride compound. The functional group equivalent weight of the component (C) may be measured by $^1$H-NMR, etc.

The polyvalent carboxylic acid compound represented by the formula (3) may be obtained by the addition reaction of tricyclodecanedimethanol with any one or more of the carboxylic anhydride compounds represented by the formulas (4) to (6).

The polyvalent carboxylic acid compound represented by the formula (3) may be produced in the presence or absence of solvent. The starting materials are often solid at room temperature (25° C.) and are therefore preferably diluted with a solvent for production from the viewpoint of workability. The solvent that may be used is not particularly limited as long as the solvent does not react with the tricyclodecanedimethanol or the carboxylic anhydride compounds represented by the formulas (4) to (6). Examples of the solvent that may be used may include, but not limited to: aprotic polar solvents such as dimethylformamide, dimethylacetamide, dimethyl sulfoxide, tetrahydrofuran, and acetonitrile; ketones such as methyl ethyl ketone, cyclopentanone, and methyl isobutyl ketone; and aromatic hydrocarbons such as toluene and xylene. Among them, an aromatic hydrocarbon or a ketone is preferred.

These solvents may be used alone or as a mixture of two or more thereof. In the case of using a solvent, the amount of the solvent used is preferably 0.5 to 300 parts by mass with respect to 100 parts by mass in total of the tricyclodecanedimethanol and any one or more of the carboxylic anhydride compounds represented by the formulas (4) to (6).

The polyvalent carboxylic acid compound represented by the formula (3) of the present invention may be produced with or without the use of a catalyst. In the case of using a catalyst, examples of the catalyst that may be used may include, but not limited to: acidic compounds such as hydrochloric acid, sulfuric acid, methanesulfonic acid, trifluoromethanesulfonic acid, p-toluenesulfonic acid, nitric acid, trifluoroacetic acid, and trichloroacetic acid; metal hydroxides such as sodium hydroxide, potassium hydroxide, calcium hydroxide, and magnesium hydroxide; amine compounds such as triethylamine, tripropylamine, and tributylamine; heterocyclic compounds such as pyridine, dimethylaminopyridine, 1,8-diazabicyclo[5.4.0]undec-7-ene, imidazole, triazole, and tetrazole; quaternary ammonium salts such as tetramethyl ammonium hydroxide, tetraethyl ammonium hydroxide, tetrapropyl ammonium hydroxide, tetrabutyl ammonium hydroxide, trimethylethyl ammonium hydroxide, trimethylpropyl ammonium hydroxide, trimethylbutyl ammonium hydroxide, trimethylcetyl ammonium hydroxide, trioctylmethyl ammonium hydroxide, tetramethyl ammonium chloride, tetramethyl ammonium bromide, tetramethyl ammonium iodide, tetramethyl ammonium acetate, and trioctylmethyl ammonium acetate; orthotitanates such as tetraethyl orthotitanate and tetramethyl orthotitanate; and metal soaps such as tin octoate, cobalt octoate, zinc octoate, manganese octoate, calcium octoate, sodium octoate, and potassium octoate.

In the case of using a catalyst, these catalysts may be used alone or as a mixture of two or more thereof. In the case of using a catalyst, the amount of the catalyst used is preferably 0.05 to 10 parts by mass with respect to 100 parts by mass in total of the tricyclodecanedimethanol and the carboxylic anhydride compound.

The method for adding the catalyst involves directly adding the catalyst or using the catalyst in a state dissolved in, for example, a solvent capable of dissolving the catalyst. In this respect, it is preferred to avoid using an alcoholic solvent such as methanol or ethanol or water because of reacting with an unreacted carboxylic anhydride compound.

The reaction temperature in the production of the polyvalent carboxylic acid compound represented by the formula (3) of the present invention differs depending on the amount of the catalyst and the solvent used and is usually 20 to 160° C., preferably 50 to 150° C., particularly preferably 60 to 145° C. Also, the total reaction time is usually 1 to 20 hours, preferably 3 to 18 hours. The reaction may be carried out at two or more stages. For example, the reaction may be carried out at 20 to 100° C. for 1 to 8 hours and then at 100 to 160° C. for 1 to 12 hours. This is because, particularly, the carboxylic anhydride compound represented by the formula (5) is highly volatile, and such a compound, when used, can be prevented from being volatilized by reaction at 20 to 100° C. in advance followed by reaction at 100 to 160° C. As a result, the polyvalent carboxylic acid compound represented by the formula (3) can be obtained as planned while the diffusion of harmful substances into the air can be suppressed.

In the case of the production using a catalyst, the catalyst may be removed, if necessary, by quenching and/or washing with water, but may be allowed to remain to be used as a curing accelerator for the epoxy resin composition.

In the case of carrying out the water washing step, a solvent separable from water is preferably added, depending on the type of the solvent used. Preferred examples of the solvent may include, but not limited to: ketones such as methyl ethyl ketone, methyl isobutyl ketone, and cyclopentanone; esters such as ethyl acetate, butyl acetate, ethyl lactate, and isopropyl butanoate; and hydrocarbons such as hexane, cyclohexane, toluene, and xylene.

The solvent used in the reaction or the washing with water may be removed by, for example, concentration under reduced pressure.

The component (C) of the present invention may be obtained after producing the polyvalent carboxylic acid compound represented by the formula (3) which is then mixed with the carboxylic anhydride compound. Alternatively, during the production of the polyvalent carboxylic acid compound represented by the formula (3), the reaction is carried out in an excess of any one or more of the carboxylic anhydride compounds represented by the formulas (4) to (6) with respect to the tricyclodecanedimethanol. At the completion of the production of the polyvalent carboxylic acid compound represented by the formula (3), the component (C) of the present invention may be obtained as a mixture of the polyvalent carboxylic acid compound represented by the formula (3) and the carboxylic anhydride compound.

In the case of carrying out the reaction in the presence of an excess of any one or more of the carboxylic anhydride compounds represented by the formulas (4) to (6) in the production of the polyvalent carboxylic acid compound represented by the formula (3), the water washing step mentioned above should be avoided because an excess of the carboxylic anhydride compounds might be hydrolyzed with water in the water washing step.

In the epoxy resin composition of the present invention, the components (A) to (C) are preferably contained in the following amounts:
the amount of the component (A) is 5 to 95% by mass with respect to the total amount of the component (A) and the component (B),
the amount of the component (B) is 5 to 95% by mass with respect to the total amount of the component (A) and the component (B), and
the amount of the component (C) is 30 to 65 parts by mass with respect to 100 parts by mass in total of the component (A) and the component (B).

The components (A) to (C) contained in the aforementioned amounts are preferred because the resulting cured product attains both of excellent heat resistance and transparency and high Tg (glass transition temperature).

The components (A) to (C) are particularly preferably contained in the following amounts:
the amount of the component (A) is 20 to 80% by mass with respect to the total amount of the component (A) and the component (B),
the amount of the component (B) is 20 to 80% by mass with respect to the total amount of the component (A) and the component (B), and
the amount of the component (C) is 40 to 50 parts by mass with respect to 100 parts by mass in total of the component (A) and the component (B).

In the epoxy resin composition of the present invention, the component (A) and the component (B) are preferably contained in the following amounts:
the amount of the component (A) is 5 to 95% by mass with respect to the total amount of the component (A) and the component (B), and
the amount of the component (B) is 5 to 95% by mass with respect to the total amount of the component (A) and the component (B).

The component (A) and the component (B) are particularly preferably contained in the following amounts:
the amount of the component (A) is 20 to 80% by mass with respect to the total amount of the component (A) and the component (B), and
the amount of the component (B) is 20 to 80% by mass with respect to the total amount of the component (A) and the component (B).

In the epoxy resin composition of the present invention, the mixing ratio is set such that the total number of carboxyl groups and carboxylic anhydride groups in the epoxy resin curing agent (C) is preferably 0.4 to 0.8 mol, more preferably 0.45 to 0.6 mol, with respect to 1 mol of the total number of epoxy groups in the whole epoxy resin.

The mixing ratio of 0.4 mol or more is preferred because the resulting cured product is excellent in mechanical physical properties. The mixing ratio of 0.8 mol or less is preferred because the resulting cured product is excellent in heat resistance and transparency.

In the epoxy resin composition of the present invention, the silicone-modified epoxy resins (A) and (B) may be mixed with an additional epoxy resin for use. Examples of the additional epoxy resin may include, but not limited to, epoxy resins which are glycidyl etherified products of phenol compounds, epoxy resins which are glycidyl etherified products of various novolac resins, alicyclic epoxy resins, aliphatic epoxy resins, heterocyclic epoxy resins, glycidyl ester-based epoxy resins, glycidylamine-based epoxy resins, epoxy resins obtained by the glycidylation of halogenated phenols, and copolymers of polymerizable unsaturated compounds having an epoxy group and other polymerizable unsaturated compounds.

In the case of mixing and using an additional epoxy resin, the amount of the additional epoxy resin used is preferably set such that the additional epoxy resin is mixed with 50% by mass or more, more preferably 70% by mass or more, particularly preferably 80% by mass or more, in total of the silicone-modified epoxy resins (A) and (B) in the whole epoxy resin, from the viewpoint of the heat resistance and transparency of a cured product.

The epoxy resin composition of the present invention may also contain an epoxy resin curing agent in addition to the epoxy resin curing agent (C) comprising the polyvalent carboxylic acid represented by the formula (3) and the carboxylic anhydride compound. Examples thereof may include, but not limited to, amine-based curing agents, phenol-based curing agents, and polyvalent carboxylic acid resins. In the case of mixing and using an additional epoxy resin curing agent, the amount of the additional epoxy resin curing agent used is preferably set such that the additional epoxy resin curing agent is mixed with 50% by mass or more, more preferably 70% by mass or more, particularly preferably 80% by mass or more, of the epoxy resin curing agent (C) in the whole epoxy resin curing agent, from the viewpoint of the heat resistance and transparency of a cured product.

The epoxy resin composition of the present invention may contain (D) an epoxy resin curing accelerator in addition to the silicone-modified epoxy resins (A) and (B) and the epoxy resin curing agent (C).

Hereinafter, the epoxy resin curing accelerator (D) will be described.

Examples of the epoxy resin curing accelerator (D) may include, but not limited to: quaternary phosphonium salts such as tetrabutylphosphonium O,O-diethyl phosphorodithioate and tetraphenylphosphonium tetraphenylborate; organic phosphine-based curing catalysts such as triphenylphosphine and diphenylphosphine; tertiary amine-based curing catalysts such as 1,8-diazabicyclo[5.4.0]undecene-7, triethanolamine, and benzyldimethylamine; quaternary ammonium salts such as 1,8-diazabicyclo[5.4.0]undecene-7 phenol salt, 1,8-diazabicyclo[5.4.0]undecene-7 octoate, 1,8-diazabicyclo[5.4.0]undecene-7 p-toluenesulfonate, and 1,8-diazabicyclo[5.4.0]undecene-7 formate; organic carboxylates such as zinc octoate and zinc naphthenate; aluminum chelating compounds such as aluminum bis-ethylacetoacetate-monoacetylacetonate and aluminum ethylacetoacetate-diisopropylate; imidazoles such as 2-methylimidazole and 2-phenyl-4-methylimidazole; thermal cationic curing accelerators such as aromatic sulfonium salts, aromatic iodonium salts, and antimony-based sulfonium salts; and optical cationic curing accelerators such as antimony-based sulfonium salts and phosphorus-based sulfonium salts.

The amount of the epoxy resin curing accelerator (D) contained is 0.01 to 3 parts by mass, preferably 0.05 to 1.5 parts by mass, with respect to 100 parts by mass in total of the components (A) to (C). If the amount of the epoxy resin curing accelerator (D) contained is smaller than the aforementioned lower limit, the effect of accelerating the reaction of the epoxy resins with the curing agent might be insufficient. On the other hand, if the amount of the epoxy resin curing accelerator (D) contained is larger than the aforementioned upper limit, this curing accelerator might be responsible for discoloration during curing or during a reflow test.

The epoxy resin composition of the present invention may contain (E) an antioxidant in addition to the silicone-modified epoxy resins (A) and (B), the epoxy resin curing agent (C), and the epoxy resin curing accelerator (D).

Hereinafter, the antioxidant (E) will be described.

An antioxidant known in the art, such as a phosphorus-based antioxidant, a phenol-based antioxidant, a sulfur-based antioxidant, or HALS (hindered amine light stabilizer), may be added as the antioxidant (E). For the epoxy resin composition of the present invention, a phosphorus-based antioxidant or a phenol-based antioxidant is preferred from the viewpoint of the high transparency of a cured product and the maintenance of the transparency.

The phosphorus-based antioxidant is not particularly limited as long as the phosphorus-based antioxidant contains a phosphorus atom in its structure and has the function of preventing the oxidation of resins and/or a cured product. Examples thereof may include, but not limited to, 1,1,3-tris(2-methyl-4-ditridecylphosphite-5-tert-butylphenyl)butane, distearyl pentaerythritol diphosphite, bis(2,4-di-tert-butylphenyl) pentaerythritol diphosphite, bis(2,6-di-tert-butyl-4-methylphenyl) pentaerythritol diphosphite, phenyl bisphenol A pentaerythritol diphosphite, dicyclohexyl pentaerythritol diphosphite, tris(diethylphenyl)phosphite, tris(di-isopropylphenyl)phosphite, tris(di-n-butylphenyl)phosphite, tris(2,4-di-tert-butylphenyl)phosphite, tris(2,6-di-tert-butylphenyl)phosphite, tris(2,6-di-tert-butylphenyl)phosphite, 2,2'-methylenebis(4,6-di-tert-butylphenyl)(2,4-di-tert-butylphenyl)phosphite, 2,2'-methylenebis(4,6-di-tert-butylphenyl)(2-tert-butyl-4-methylphenyl)phosphite, 2,2'-methylenebis(4-methyl-6-tert-butylphenyl)(2-tert-butyl-4-methylphenyl)phosphite, 2,2'-ethylidenebis(4-methyl-6-tert-butylphenyl)(2-tert-butyl-4-methylphenyl)phosphite, tetrakis(2,4-di-tert-butylphenyl)-4,4'-biphenylene diphosphonite, tetrakis(2,4-di-tert-butylphenyl)-4,3'-biphenylene diphosphonite, tetrakis(2,4-di-tert-butylphenyl)-3,3'-biphenylene diphosphonite, tetrakis(2,6-di-tert-butylphenyl)-4,4'-biphenylene diphosphonite, tetrakis(2,6-di-tert-butylphenyl)-4,3'-biphenylene diphosphonite, tetrakis(2,6-di-tert-butylphenyl)-3,3'-biphenylene diphosphonite, bis(2,4-di-tert-butylphenyl)-4-phenyl-phenylphosphonite, bis(2,4-di-tert-butylphenyl)-3-phenyl-phenylphosphonite, bis(2,6-di-n-butylphenyl)-3-phenyl-phenylphosphonite, bis(2,6-di-tert-butylphenyl)-4-phenyl-phenylphosphonite, bis(2,6-di-tert-butylphenyl)-3-phenyl-phenylphosphonite, tetrakis(2,4-di-tert-butyl-5-methylphenyl)-4,4'-biphenylene diphosphonite, tributyl phosphate, trimethyl phosphate, tricresyl phosphate, triphenyl phosphate, trichlorophenyl phosphate, triethyl phosphate, diphenylcresyl phosphate, diphenyl monoorthoxenyl phosphate, tributoxyethyl phosphate, dibutyl phosphate, dioctyl phosphate, diisopropyl phosphate, and 9,10-dihydro-9-oxa-10-phosphaphenanthrene-10-oxide.

A commercially available product may be used as the phosphorus-based antioxidant. Preferred examples of the commercially available phosphorus-based compound may include, but not limited to, ADK STAB PEP-4C, ADK STAB PEP-8, ADK STAB PEP-24G, ADK STAB PEP-36, ADK STAB HP-10, ADK STAB 2112, ADK STAB 260, ADK STAB 522A, ADK STAB 1178, ADK STAB 1500, ADK STAB C, and ADK STAB 135A (all manufactured by ADEKA Corp.), and HCA manufactured by Sanko Co., Ltd.

The phenol-based antioxidant is not particularly limited as long as the phenol-based antioxidant contains a phenolic hydroxy group in its structure and has the function of preventing the oxidation of resins and/or a cured product. Examples thereof may include, but not limited to, 2,6-ditert-butyl-4-methylphenol, n-octadecyl-3-(3,5-di-tert-butyl-4-hydroxyphenyl)propionate, tetrakis[methylene-3-(3,5-di-tert-butyl-4-hydroxyphenyl)propionate]methane, 2,4-di-tert-butyl-6-methylphenol, 1,6-hexanediol-bis-[3-(3,5-di-tert-butyl-4-hydroxyphenyl)propionate], tris(3,5-di-tert-butyl-4-hydroxybenzyl)-isocyanurate, 1,3,5-trimethyl-2,4,6-tris(3,5-di-tert-butyl-4-hydroxybenzyl)benzene, pentaerythrityl-tetrakis[3-(3,5-di-tert-butyl-4-hydroxyphenyl)propionate], 3,9-bis-[2-[3-(3-tert-butyl-4-hydroxy-5-methylphenyl)-propionyloxy]-1,1-dimethylethyl]-2,4,8,10-tetraoxaspiro[5,5]undecane, triethylene glycol-bis[3-(3-t-butyl-5-methyl-4-hydroxyphenyl)propionate], 2,2'-butylidenebis(4,6-di-tert-butylphenol), 4,4'-butylidenebis(3-methyl-6-tert-butylphenol), 2,2'-methylenebis(4-methyl-6-tert-butylphenol), 2,2'-methylenebis(4-ethyl-6-tert-butylphenol), 2-tert-butyl-6-(3-tert-butyl-2-hydroxy-5-methylbenzyl)-4-methylphenol acrylate, 2-[1-(2-hydroxy-3,5-di-tert-pentylphenyl)ethyl]-4,6-di-tert-pentylphenyl acrylate, 4,4'-thiobis(3-methyl-6-tert-butylphenol), 4,4'-butylidenebis(3-methyl-6-tert-butylphenol), 2-tert-butyl-4-methylphenol, 2,4-di-tert-butylphenol, 2,4-di-tert-pentylphenol, 4,4'-thiobis(3-methyl-6-tert-butylphenol), 4,4'-butylidenebis(3-methyl-6-tert-butylphenol), bis-[3,3-bis-(4'-hydroxy-3'-tert-butylphenyl)-butanoic acid]-glycol ester, 2,4-di-tert-butylphenol, 2,4-di-tert-pentylphenol, 2-[1-(2-hydroxy-3,5-di-tert-pentylphenyl)ethyl]-4,6-di-tert-pentylphenyl acrylate, and bis-[3,3-bis-(4'-hydroxy-3'-tert-butylphenyl)-butanoic acid]-glycol ester.

A commercially available product may be used as the phenol-based antioxidant. Examples of the commercially available phenol-based compound may include, but not limited to, IRGANOX 1010, IRGANOX 1035, IRGANOX 1076, IRGANOX 1135, IRGANOX 245, IRGANOX 259, IRGANOX 295, IRGANOX 3114, IRGANOX 1098, and IRGANOX 1520L (all manufactured by Chiba Specialty Chemicals Corp.), ADK STAB AO-20, ADK STAB AO-30, ADK STAB AO-40, ADK STAB AO-50, ADK STAB AO-60, ADK STAB AO-70, ADK STAB AO-80, ADK STAB AO-90, and ADK STAB AO-330 (all manufactured by ADEKA Corp.), and Sumilizer GA-80, Sumilizer MDP-S, Sumilizer BBM-S, Sumilizer GM, Sumilizer GS(F), and Sumilizer GP (all manufactured by Sumitomo Chemical Co., Ltd.).

Two or more types may be used in combination as the antioxidant (E). Particularly, a phosphorus-based antioxidant and a phenol-based antioxidant are preferably used in combination from the viewpoint of the maintenance of the transparency of a cured product.

The amount of the antioxidant (E) contained is 0.01 to 3 parts by mass, preferably 0.02 to 1.5 parts by mass, with respect to 100 parts by mass in total of the components (A) to (C). If the amount of the antioxidant (E) contained is smaller than the aforementioned lower limit, the resulting cured product might be inferior in heat resistance and transparency. On the other hand, if the amount of the antioxidant (E) contained is larger than the aforementioned upper limit, this antioxidant might be responsible for discoloration during curing or during a reflow test.

Other Components

The components described above may be used, if necessary, in combination with an additive routinely used, for example, an ultraviolet absorber, an antidegradant, a phosphor, a heat plasticizer, and/or a diluent.

The epoxy resin composition of the present invention may be produced by formulating the components described above and, if necessary, various additives and dissolving or melt-mixing these components. The melt mixing may be carried out by a method known in the art. For example, these components may be placed in a reactor and melt-mixed in a batch manner. Alternatively, these components may be placed in a kneading machine such as a kneader or a triple heat roll and continuously melt-mixed. The epoxy resin curing accelerator (D) may be dissolved by heating and mixed in advance into the epoxy resin curing agent (C). At the final stage of mixing, this mixture is preferably dispersed and mixed with the silicone-modified epoxy resin (A), the component (B), etc.

In a cured product prepared by curing the epoxy resin composition of the present invention, a temperature at a relative maximum point of the loss coefficient (tan $\delta$=E"/E') indicated by a quotient of a loss elastic modulus (E") divided by a storage elastic modulus (Er) is preferably 145° C. or higher in DMA (dynamic mechanical analysis).

The temperature at a relative maximum point of the loss coefficient lower than 145° C. is not preferred because the epoxy resin composition used for optical semiconductor sealing tends to cause errors such as cracks or the absence of lighting in the heat cycle test of the optical semiconductor (e.g., LED).

EXAMPLES

Hereinafter, the present invention will be described in more detail with reference to Synthesis Examples and Examples. The present invention is not intended to be limited by these Synthesis Examples and Examples. In Synthesis Examples and Examples, each physical property value was measured by a method given below. In this context, the term "part" means parts by mass unless otherwise specified.

GPC: GPC (gel permeation chromatography) measurement was conducted under the following conditions:
  Manufacture: Waters Corp.
  Column: SHODEX GPC LF-G (gourd column), KF-603, KF-602.5, KF-602, and KF-601 (two columns)
  Flow rate: 0.4 ml/min.
  Column temperature: 40° C.
  Solvent used: THF (tetrahydrofuran)
  Detector: RI (differential refractometer)
Epoxy equivalent weight: measured by the method described in JIS K7236: 2001.
Functional group equivalent weight: measured by the following method:
  Approximately 0.15 g of a mixture of a polyvalent carboxylic acid compound and a carboxylic anhydride compound was weighed and dissolved in 40 ml of methanol (special-grade reagent). Then, the solution was stirred at 20 to 28° C. for 10 minutes and used as a measurement sample. The measurement sample was titrated with a 0.1 N sodium hydroxide solution using a titration apparatus AT-610 manufactured by Kyoto Electronics Manufacturing Co., Ltd. to obtain an acid value (mg/KOH).

Synthesis Example 1

Synthesis of Organopolysiloxane 1 Having SiH Group
  Phenyltrimethoxysilane (1 mol, 198.44 g) and 30 g of acetonitrile were mixed and cooled until the internal temperature became 10° C. or lower. Then, 16 g of concentrated sulfuric acid was added dropwise thereto over 30 minutes, and then, 81 g of water was added dropwise thereto over 1 hour. Next, 1,1,3,3-tetramethyl-1,3-disiloxane (1.5 mol, 201.48 g) was added dropwise thereto over 30 minutes, and the mixture was stirred overnight. After separation of wasted acid, 500 g of toluene was added to the residue, and the mixture was washed with hot water three times and hot pure water twice. The obtained toluene solution was distilled under reduced pressure to obtain organopolysiloxane 1 composed mainly of a compound represented by the formula (13) shown below. The obtained organopolysiloxane 1 had a purity of 97% (calculated from the peak area of the main component in the molecular weight distribution of GPC).

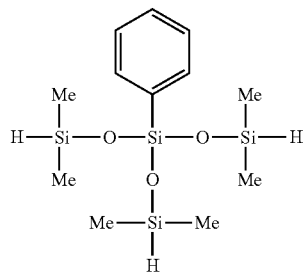

(13)

Synthesis Example 2

Synthesis of Organopolysiloxane 2 Having SiH Group

Diphenyldimethoxysilane (1 mol, 244.36 g) and 10 g of acetonitrile were mixed and cooled until the internal temperature became 10° C. or lower. Then, 19 g of concentrated sulfuric acid was added dropwise thereto over 30 minutes, and then, 43 g of water was added dropwise thereto over 1 hour. Next, 1,1,3,3-tetramethyl-1,3-disiloxane (3 mol, 402.96 g) was added dropwise thereto over 30 minutes, and the mixture was stirred overnight. After separation of wasted acid, 500 g of toluene was added to the residue, and the mixture was washed with hot water three times and hot pure water twice. The obtained toluene solution was distilled under reduced pressure to obtain organopolysiloxane 2 composed mainly of a compound represented by the formula (14) shown below. The obtained organopolysiloxane 2 had a purity of 97% (calculated from the peak area of the main component in the molecular weight distribution of GPC).

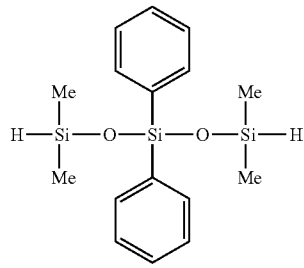

(14)

Synthesis Example 3

Synthesis of Organopolysiloxane 3 Having SiH Group

Diphenyldimethoxysilane (1.0 mol, 244.36 g) and 7 g of acetonitrile were mixed and cooled until the internal temperature became 10° C. or lower. Then, 14 g of sulfuric acid was added dropwise thereto over 30 minutes, and then, 43 g of water was added dropwise thereto over 1 hour. Next, 1,1,3,3-tetramethyl-1,3-disiloxane (0.75 mol, 100.73 g) was added dropwise thereto over 30 minutes, and the mixture was stirred overnight. After separation of wasted acid, 500 g of toluene was added to the residue, and the mixture was washed with hot water three times and hot pure water twice. The obtained toluene solution was distilled under reduced pressure to obtain organopolysiloxane 3 composed mainly of a compound represented by the formula (15) shown below.

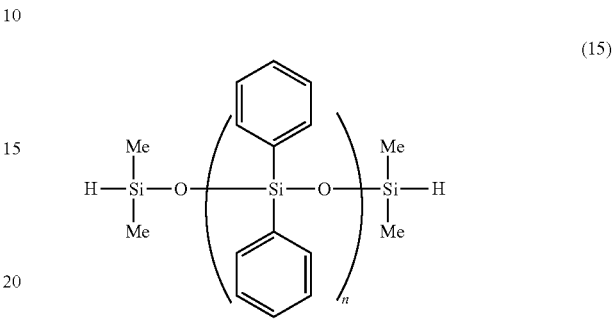

(15)

wherein n=2.0 (average).

Synthesis Example 4

(A) Synthesis of Silicone-modified Epoxy Resin (A-1)

1.68 g of a toluene solution containing 0.5% by mass of chloroplatinic acid, 200 g of toluene, and 1,2-epoxy-4-vinylcyclohexane (2.4 mol, 596.06 g) were placed in a 2-L separable flask and stirred. Then, the internal temperature was raised to 80° C. Then, 2,4,6,8-tetramethylcyclotetrasiloxane (1 mol, 240.51 g) was added dropwise thereto over 1 hour, and the mixture was reacted at 100° C. for 2 hours. The obtained toluene solution was distilled under reduced pressure to obtain a silicone-modified epoxy resin (A-1) composed mainly of a compound (16) given below. The silicone-modified epoxy resin (A-1) had an epoxy equivalent weight of 200 g/eq.

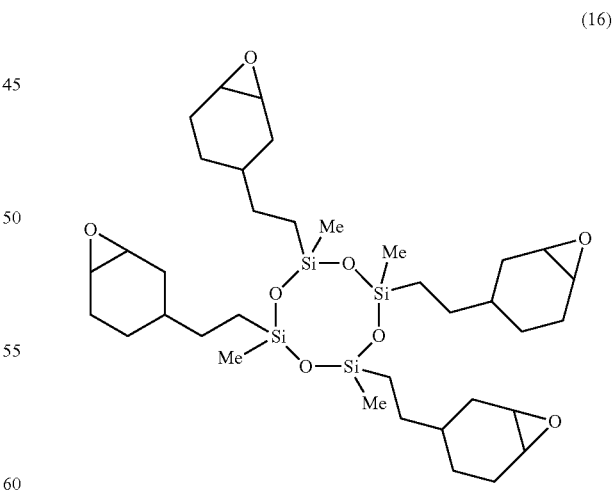

(16)

Synthesis Example 5

(B) Synthesis of Silicone-modified Epoxy Resin (B-1)

0.38 g of a toluene solution containing 0.5% by mass of chloroplatinic acid, 200 g of toluene, and 1,2-epoxy-4- vinylcyclohexane (3.6 mol, 447 g) were placed in a 2-L separable flask and stirred. Then, the internal temperature was raised to 80° C. Then, organopolysiloxane 1 (1 mol, 330.76 g) obtained above was added dropwise thereto over 1 hour, and the mixture was reacted at 100° C. for 2 hours. The obtained toluene solution was distilled under reduced pressure to obtain a silicone-modified epoxy resin (B-1) composed mainly of a compound (17) given below. The silicone-modified epoxy resin (B-1) had an epoxy equivalent weight of 237 g/eq.

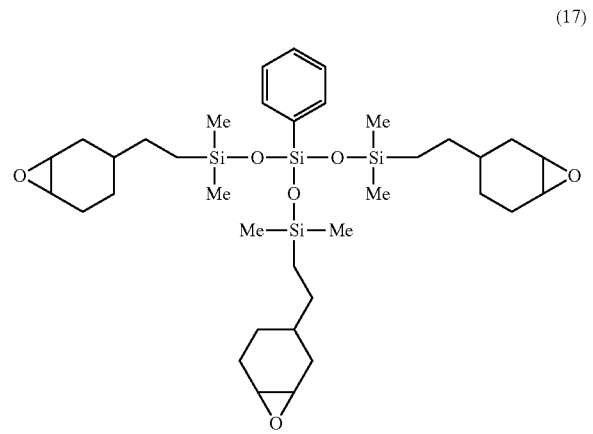 [SMILES: C[Si](C)(CCC1CCC2OC2C1)O[Si](O[Si](C)(C)CCC1CCC2OC2C1)(O[Si](C)(C)CCC1CCC2OC2C1)c1ccccc1]

(17)

Synthesis Example 6

Synthesis of Silicone-modified Epoxy Resin (EP-1)

0.26 g of a toluene solution containing 0.5% by mass of chloroplatinic acid, 200 g of toluene, and 1,2-epoxy-4-vinylcyclohexane (2.4 mol, 298.03 g) were placed in a 2-L separable flask and stirred. Then, the internal temperature was raised to 80° C. Then, organopolysiloxane 2 (1 mol, 332.61 g) obtained above was added dropwise thereto over 1 hour, and the mixture was reacted at 100° C. for 2 hours. The obtained toluene solution was distilled under reduced pressure to obtain a silicone-modified epoxy resin (EP-1) composed mainly of a compound (18) given below. The silicone-modified epoxy resin (EP-1) had an epoxy equivalent weight of 296 g/eq.

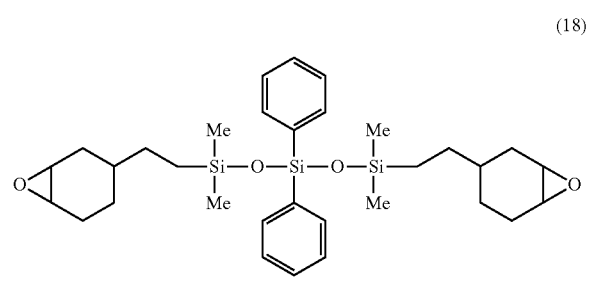 [SMILES: C[Si](C)(CCC1CCC2OC2C1)O[Si](O[Si](C)(C)CCC1CCC2OC2C1)(c1ccccc1)c1ccccc1]

(18)

Synthesis Example 7

Synthesis of Silicone-modified Epoxy Resin (EP-2)

0.78 g of a toluene solution containing 0.5% by mass of chloroplatinic acid, 200 g of toluene, and 1,2-epoxy-4-vinylcyclohexane (2.4 mol, 298.03 g) were placed in a 2-L separable flask and stirred. Then, the internal temperature was raised to 80° C. Then, organopolysiloxane 3 (1 mol, 530.91 g) obtained above was added dropwise thereto over 1 hour, and the mixture was reacted at 100° C. for 2 hours. The obtained toluene solution was distilled under reduced pressure to obtain a silicone-modified epoxy resin (EP-2) composed mainly of a compound (19) given below. The silicone-modified epoxy resin (EP-2) had an epoxy equivalent weight of 400 g/eq.

(19)

Synthesis Example 8

(C) Synthesis of Mixture (C-1) of Polyvalent Carboxylic Acid Compound and Acid Anhydride Compound 41.2 g of tricyclodecanedimethanol and 182.5 g of RIKACID MH-T (4-methylhexahydrophthalic anhydride manufactured by Shikoku Chemicals Corp.) were placed in a 500-ml glass separable flask under purging with nitrogen. A Dimroth condenser, a stirring apparatus, and a thermometer were attached to the flask, which was then dipped in an oil bath. The oil bath was heated, and the mixture was reacted for 2 hours with the internal temperature kept at 40° C. and then reacted at 50° C. for 3 hours and at 60° C. for 1.5 hours. The peak of the tricyclodecanedimethanol was confirmed to be 1% by area or smaller by GPC to obtain 223 g of an epoxy resin curing agent (C-1), which was a mixture of a polyvalent carboxylic acid compound and a carboxylic anhydride compound. The obtained composition was a clear transparent liquid, and its purity measured by GPC was 59.9% by area of a polyvalent carboxylic acid compound represented by the formula (20) given below, 0.7% by area of 4-methylhexahydrophthalic acid, and 39.4% by area of 4-methylhexahydrophthalic anhydride. The appearance was clear transparent liquid. The acid value was 294.1 mg/KOH.

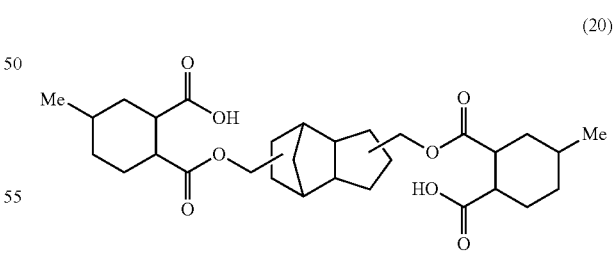

(20)

Synthesis Example 9

Synthesis of Mixture (H-1) of Polyvalent Carboxylic Acid Compound and Acid Anhydride Compound 13.1 g of tris(2-hydroxyethyl) isocyanurate and 114.6 g of RIKACID MH-T (4-methylhexahydrophthalic anhydride manufactured by Shikoku Chemicals Corp.) were placed in a 500-ml glass separable flask under purging with nitrogen.

A Dimroth condenser, a stirring apparatus, and a thermometer were attached to the flask, which was then dipped in an oil bath. The oil bath was heated, and the mixture was reacted for 2 hours with the internal temperature kept at 70° C. and then reacted at 75° C. for 2.5 hours. The peak of the tris(2-hydroxyethyl) isocyanurate was confirmed to be 1% by area or smaller by GPC to obtain 127.1 g of a polyvalent carboxylic acid composition (H-1), which was a mixture of a polyvalent carboxylic acid compound and a carboxylic anhydride compound. The obtained composition was a clear transparent liquid, and its purity measured by GPC was 37.0% by area of a polyvalent carboxylic acid represented by the formula (21) given below, 1.0% by area of 4-methylhexahydrophthalic acid, and 61.9% by area of 4-methylhexahydrophthalic anhydride. The appearance was clear transparent liquid. The acid value was 296.3 mg/KOH.

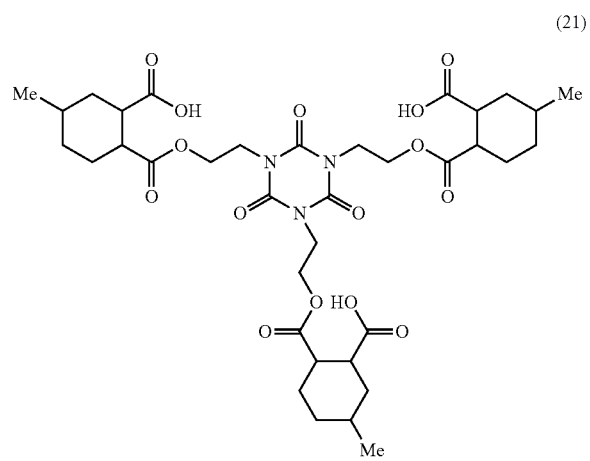 [SMILES: CC1CCC(C(=O)OCCn2c(=O)n(CCOC(=O)C3CCC(C)CC3C(=O)O)c(=O)n(CCOC(=O)C3CCC(C)CC3C(=O)O)c2=O)C(C(=O)O)C1]

(21)

Preparation of Compositions

Each resin composition was prepared according to the formulation (parts by mass) shown in Table 1 below. Each component in the table is as described below. In the table, a blank field means "0".

(D) Curing accelerator: quaternary phosphonium salt (manufactured by San-Apro Ltd., U-CAT5003)

(E-1) Phosphorus-based antioxidant: isodecyl diphenyl phosphite (manufactured by ADEKA Corp., ADK STAB 135A)
(E-2) Phenol-based antioxidant: pentaerythritol tetrakis[3-(3',5'-di-t-butyl-4'-hydroxyphenyl)propionate] (manufactured by ADEKA Corp., ADK STAB AO-60)

Evaluation on Characteristics of Compositions and Cured Products

Each obtained composition and cured product was characteristically evaluated by methods described below. Curing was carried out by heating of the composition at 100° C. for 1 hour and subsequently at 150° C. for 4 hours. The results are shown in Table 1.

(1) Viscosity

The viscosity of the uncured compositions was measured at 23° C. according to JIS Z8803: 2011 using a type B rotary viscometer (trade name: TVB-15M) manufactured by Toki Sangyo Co., Ltd.

(2) Bending Strength and Flexural Modulus

A 80 mm×10 mm×4 mm rod-shaped cured product was prepared, and its bending strength and flexural modulus were measured according to JIS K7171: 2008 using an autograph (trade name: AG-IS) manufactured by Shimadzu Corp.

(3) Heat Resistance

The light transmission rate ($T_0$) of a sheet-shaped cured product having a thickness of 0.8 mm was measured at a wavelength of 450 nm using a spectrophotometer U-3310 (manufactured by Hitachi High-Technologies Corp.). The cured product was heated at 150° C. for 250 hours. Then, the light transmission rate ($T_1$) was measured in the same way as above to determine $T_1/T_0$ (%).

(4) Hardness

The hardness of a rod-shaped cured product was measured according to JIS K6253-3: 2012 (type D).

(5) DMA (Dynamic Mechanical Analysis)

A 40 mm×5 mm×0.8 mm t plate-shaped cured product was prepared and assayed by DMA (dynamic mechanical analysis) under conditions give below. The temperature at a relative maximum point of the loss coefficient (tan $\delta$=E"/E') indicated by a quotient of a loss elastic modulus (E") divided by a storage elastic modulus (E') was determined.

DMA Assay Conditions
Manufacturer: Seiko Instruments Inc.
Model: viscoelastic spectrometer EXSTAR DMS6100
Measurement temperature: −50° C. to 150° C.
Rate of temperature increase: 2° C./min
Frequency: 10 Hz
Measurement mode: tensile vibration

TABLE 1

| Formulation | | | Example 1 | Comparative Example 1 |
|---|---|---|---|---|
| (A) Silicone-modified epoxy resin | A-1 | | 50 | 50 |
| (B) Silicone-modified epoxy resin | B-1 | | 50 | 50 |
| (C) Epoxy resin curing agent | C-1 | | 64.7 | |
| Epoxy resin curing agent | H-1 | | | 71.6 |
| (D) Curing accelerator | U-CAT5003 | | 0.5 | 0.5 |
| (E) Phosphorus-based antioxidant | ADK STAB 135A | | 0.3 | 0.3 |
| (E) Phenol-based antioxidant | ADK STAB AO-60 | | 0.3 | 0.3 |
| Characteristic evaluation | | | | |
| Viscosity (23° C.) | | mPa · s | 3866 | 1587 |
| Heat resistance | | % | 92.3 | 89.8 |
| Hardness (Type D) | | — | 88 | 87 |
| DMA | | ° C. | 183 | 172 |

As is evident from the results of Table 1, the composition of Example 1 was excellent in heat resistance, exhibited high tans in DMA, and yielded an excellent cured product. By contrast, the composition of Comparative Example 1 exhibited high tans, but yielded a cured product inferior in heat resistance.

Preparation of Compositions

Each resin composition was prepared according to the formulation (parts by mass) shown in Table 2 below. Each component in the table is as described below. In the table, a blank field means "0".

(D) Curing accelerator: quaternary phosphonium salt (manufactured by San-Apro Ltd., U-CAT5003)

(E-1) Phosphorus-based antioxidant: isodecyl diphenyl phosphite (manufactured by ADEKA Corp., ADK STAB 135A)

(E-2) Phenol-based antioxidant: pentaerythritol tetrakis[3-(3',5'-di-t-butyl-4'-hydroxyphenyl)propionate] (manufactured by ADEKA Corp., ADK STAB AO-60)

Evaluation of Characteristics of Compositions and Cured Products

Each obtained composition and cured product was characteristically evaluated by methods given below in addition to the tests of the preceding paragraphs (1) to (5). Curing was carried out by heating of the composition at 100° C. for 1 hour and subsequently at 150° C. for 4 hours. The results are shown in Table 2.

(6) Moisture Vapor Transmission Rate

The moisture vapor transmission rate of each cured product having a thickness of 0.5 mm was measured according to JIS K 7129: 2008.

(7) Heat Cycle Test

A light-emitting device having an emission wavelength of 450 nm was mounted to each of surface mount-type PPA (polyphthalamide) LED packages having 4 types of sizes given below and carrying a copper electrode plated at its undersurface with silver. The electrode was connected to the light-emitting device using a gold wire in the surface mount-type LED. An uncured composition was filled into a syringe and casted to the surface mount-type LED using a precision discharge apparatus such that the opening became flat surface. The resultant was cured. Each package sealed with each composition was energized to confirm that the light-emitting device was able to emit light. Then, the heat cycle test was conducted under conditions give below to evaluate each status given below as being good or poor.

Package Sizes Used in Evaluation

Package 1: 5.0 mm×5.0 mm×1.4 mm t (sealing part: 0.6 mm t)

Package 2: 3.2 mm×2.8 mm×1.4 mm t (sealing part: 0.6 mm t)

Package 3: 3.0 mm×1.4 mm×1.2 mm t (sealing part: 0.4 mm t)

Package 4: 3.5 mm×0.4 mm×1.2 mm t (sealing part: 0.4 mm t)

Heat Cycle Test Conditions

Manufacturer: Espec Corp.

Model: Thermal Shock Chamber TSA-41L

Test conditions; the test was conducted by 200 cycles each involving −40° C. (retained for 30 minutes)→heating→100° C. (retained for 30 minutes)→cooling→−40° C.

Status After Test

Good: No crack was confirmed in the sealing material, no peeling from the package substrate was confirmed, and the light-emitting device was confirmed to light up by energization.

Poor: The sealing material was cracked, and/or peeling from the package substrate was confirmed, and/or the light-emitting device did not light up.

TABLE 2

| Formulation | | Example | | | Comparative Example | | | |
|---|---|---|---|---|---|---|---|---|
| | | 2 | 3 | 4 | 2 | 3 | 4 | 5 |
| (A) Silicone-modified epoxy resin | A-1 | 75 | 50 | 25 | 100 | | 50 | 50 |
| (B) Silicone-modified epoxy resin | B-1 | 25 | 50 | 75 | | 100 | | |
| Silicone-modified epoxy resin | EP-1 | | | | | | 50 | |
| | EP-2 | | | | | | | 50 |
| (C) Epoxy resin curing agent | C-1 | 43.5 | 41.2 | 46.6 | 45.8 | 36.6 | 44.5 | 40.5 |
| (D) Curing accelerator | U-CAT5003 | 0.4 | 0.4 | 0.4 | 0.4 | 0.4 | 0.4 | 0.4 |
| (E) Phosphorus-based antioxidant | ADK STAB 135A | 0.3 | 0.3 | 0.3 | 0.3 | 0.3 | 0.3 | 0.3 |
| (E) Phenol-based antioxidant | ADK STAB AO-60 | 0.3 | 0.3 | 0.3 | 0.3 | 0.3 | 0.3 | 0.3 |
| Characteristic evaluation | | | | | | | | |
| Viscosity (23° C.) | mPa·s | 4096 | 2406 | 1613 | 13952 | 1038 | 4636 | 4839 |
| Bending strength | MPa | 56 | 63 | 61 | 42 | 46 | 43 | 49 |
| Flexural modulus | N/mm$^2$ | 1800 | 1700 | 1600 | 2000 | 1800 | 1600 | 1600 |
| Heat resistance | % | 98 | 99.5 | 98.8 | 94.4 | 97.2 | 95.2 | 89.6 |
| Hardness (Type D) | — | 88 | 85 | 84 | 80 | 83 | 82 | 84 |
| DMA | ° C. | 174 | 157 | 159 | 194 | 126 | 157 | 149 |
| Moisture vapor transmission rate | g/m$^2$·24 h, 0.5 mm thick | 4 | 5 | 6 | 7 | 9 | 8 | 6 |
| Heat cycle test (package 1) | — | Good | Good | Good | Good | Poor | Good | Poor |
| Heat cycle test (package 2) | — | Good | Good | Good | Good | Poor | Good | Good |
| Heat cycle test (package 3) | — | Good | Good | Good | Good | Poor | Good | Poor |
| Heat cycle test (package 4) | — | Good | Good | Good | Good | Poor | Good | Good |

As is evident from Table 2, the compositions of Examples 2 to 4 were excellent in strength, heat resistance, and low permeability to gas. In addition, these compositions did not cause problems such as cracks and the absence of lighting in any of the packages in the heat cycle test where the optical semiconductor was sealed therewith. By contrast, the compositions of Comparative Examples 2 and 4 produced excellent results in the heat cycle test, but were inferior in heat resistance. The composition of Comparative Example 3 was excellent in heat resistance, but produced poor results in the heat cycle test. The composition of Comparative Example 5 produced poor results about both heat resistance and the heat cycle test.

What is claimed is:

1. An epoxy resin composition comprising the following components (A) to (C):

(A) a silicone-modified epoxy resin represented by the formula (1),

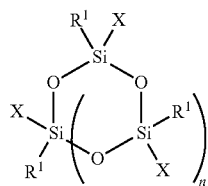

(1)

wherein $R^1$ represents a monovalent aliphatic hydrocarbon group having 1 to 6 carbon atoms or a monovalent aromatic hydrocarbon group having 6 to 12 carbon atoms; X is selected from a group consisting of a 3,4-epoxycyclohexylethyl group and a 3-glycidoxypropyl group; n represents an integer of 1 to 3; and a plurality of groups $R^1$ or X present in the formula are the same or different from each other;

(B) a silicone-modified epoxy resin represented by the formula (2),

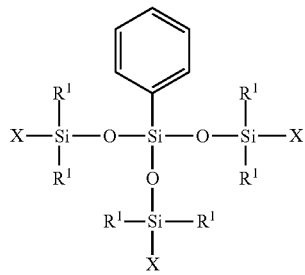

(2)

wherein $R^1$ and X are each as defined above; and a plurality of groups $R^1$ or X present in the formula are the same or different from each other; and (C) an epoxy resin curing agent containing a polyvalent carboxylic acid represented by the formula (3) and a carboxylic anhydride compound:

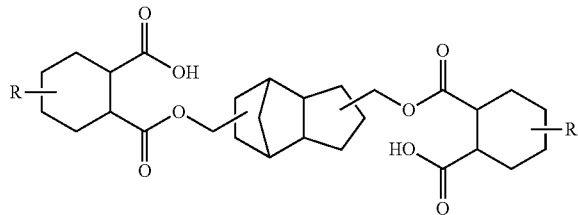

(3)

wherein R is selected from the group consisting of methyl, COOH and H, wherein the components (A) to (C) are contained at the following ratios:

the amount of the component (A) is 20 to 80% by mass with respect to the total amount of the component (A) and the component (B), the amount of the component (B) is 20 to 80% by mass with respect to the total amount of the component (A) and the component (B), and wherein the mixing ratio is set such that the total number of carboxyl groups and carboxylic anhydride groups in the epoxy resin curing agent (C) is 0.4 to 0.7 mol with respect to 1 mol of the total number of epoxy groups in the whole epoxy resin composition.

2. The epoxy resin composition according to claim 1, wherein X is a 3,4-epoxycyclohexylethyl group.

3. The epoxy resin composition according to claim 1, further comprising (D) an epoxy resin curing accelerator.

4. The epoxy resin composition according to claim 3, further comprising (E) an antioxidant.

5. The epoxy resin composition according to claim 1, wherein the epoxy resin composition offers a cured product in which the temperature at a relative maximum point of the loss coefficient (tanδ=E"/E') indicated by a quotient of a loss elastic modulus (E") divided by a storage elastic modulus (E') is 145° C. or higher in DMA (dynamic mechanical analysis) analysis.

6. A cured product prepared by curing an epoxy resin composition according to claim 1.

7. The epoxy resin composition according to claim 1, wherein the epoxy resin composition is used for optical semiconductor sealing.

8. The epoxy resin composition according to claim 1, wherein the component (B) is a silicone-modified epoxy resin represented by the following formula:

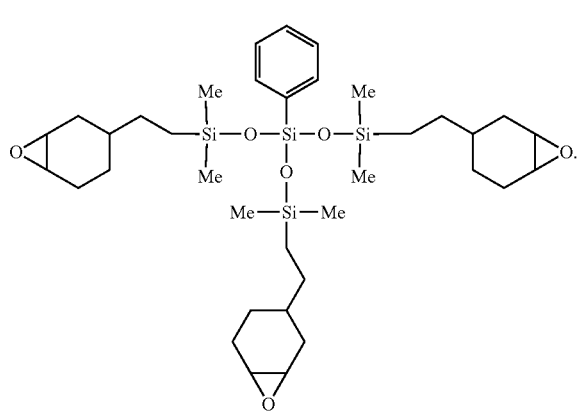 [SMILES: C[Si](C)(CCC1CCC2OC2C1)O[Si](O[Si](C)(C)CCC1CCC2OC2C1)(O[Si](C)(C)CCC1CCC2OC2C1)c1ccccc1]

* * * * *